(12) United States Patent
Kohno

(10) Patent No.: US 9,576,768 B2
(45) Date of Patent: Feb. 21, 2017

(54) MULTIPOLE LENS AND CHARGED PARTICLE BEAM SYSTEM

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/000,134

(22) Filed: Jan. 19, 2016

(65) Prior Publication Data

US 2016/0225576 A1 Aug. 4, 2016

(30) Foreign Application Priority Data

Jan. 20, 2015 (JP) .................................... 2015-8293

(51) Int. Cl.
*H01J 37/141* (2006.01)

(52) U.S. Cl.
CPC ........ *H01J 37/141* (2013.01); *H01J 2237/141* (2013.01); *H01J 2237/26* (2013.01)

(58) Field of Classification Search
USPC ...................................... 250/396 ML, 396 R
See application file for complete search history.

(56) References Cited

U.S. PATENT DOCUMENTS

2010/0072387 A1* 3/2010 Sawada ................. H01J 37/153
250/396 ML

FOREIGN PATENT DOCUMENTS

JP  2005302405 A  10/2005

* cited by examiner

*Primary Examiner* — Kiet T Nguyen
(74) *Attorney, Agent, or Firm* — The Webb Law Firm

(57) ABSTRACT

A multipole lens is provided which is for use in electron microscopy and which is simple in structure but capable of producing X- and Y-components of a quadrupole field and X- and Y-components of an octopole field. The multipole lens (100) comprises: first through twelfth polar elements (10-1 to 10-12); first through sixteenth coils (20-1 to 20-16); a first power supply (30-1) for supplying currents to the coils (20-1, 20-4, 20-9, 20-12); a second power supply (30-2) for supplying currents to the coils (20-3, 20-5, 20-11, 20-13); a third power supply (30-3) for supplying excitation currents to the coils (20-6, 20-8, 20-14, 20-16); and a fourth power supply (30-4) for supplying excitation currents to the coils (20-2, 20-7, 20-10, 20-15). The coils (20-1, 20-3, 20-6, 20-7, 20-9, 20-11, 20-14, 20-15) produce magnetic fields in a first direction. The coils (20-2, 20-4, 20-5, 20-8, 20-10, 20-12, 20-13, 20-16) produce magnetic fields in a direction opposite to the first direction.

8 Claims, 6 Drawing Sheets

| Polepiece Number | 1 | 2 | 3 | 4 | 5 | 6 | 7 | 8 | 9 | 10 | 11 | 12 |
|---|---|---|---|---|---|---|---|---|---|---|---|---|
| First Power Supply | 1 | 0 | -1 | 0 | 0 | 0 | 1 | 0 | -1 | 0 | 0 | 0 |
| Second Power Supply | 0 | 1 | 0 | -1 | 0 | 0 | 0 | 1 | 0 | -1 | 0 | 0 |
| Third Power Supply | 0 | 0 | 0 | 1 | 1 | -1 | 0 | 0 | 0 | 1 | 0 | -1 |
| Fourth Power Supply | -1 | 0 | 0 | 0 | 1 | 0 | -1 | 0 | 0 | 0 | 1 | 0 |

FIG. 2

| Polepiece Number | 1 | 2 | 3 | 4 | 5 | 6 | 7 | 8 | 9 | 10 | 11 | 12 |
|---|---|---|---|---|---|---|---|---|---|---|---|---|
| Quadrupole X | 1.000 | 0.268 | -0.732 | -1.000 | -0.268 | 0.732 | 1.000 | 0.268 | -0.732 | -1.000 | -0.268 | 0.732 |
| Quadrupole Y | 0.268 | 1.000 | 0.732 | -0.268 | -1.000 | -0.732 | 0.268 | 1.000 | 0.732 | -0.268 | -1.000 | -0.732 |
| Octopole X | 1.000 | -0.732 | -0.268 | 1.000 | -0.732 | -0.268 | 1.000 | -0.732 | -0.268 | 1.000 | -0.732 | -0.268 |
| Octopole Y | 0.268 | 0.732 | -1.000 | 0.268 | 0.732 | -1.000 | 0.268 | 0.732 | -1.000 | 0.268 | 0.732 | -1.000 |

FIG. 4

MULTIPOLE LENS AND CHARGED PARTICLE BEAM SYSTEM

BACKGROUND OF THE INVENTION

Field of the Invention

The present invention relates to a multipole lens and also to a charged particle beam system.

Description of Related Art

In recent years, there have been known charged particle beam systems such as a transmission electron microscope (TEM) and a scanning electron microscope (SEM) each equipped with an aberration corrector for correcting aberrations. Aberration correctors operate to correct aberrations by applying a magnetic field, an electric field, or a superimposition of these fields to a passage for a charged particle beam (such as an electron beam) by the use of multipole lenses (see, for example, JP-A-2005-302405).

For example, octopole fields are used for corrections of four-fold astigmatism and spherical aberration. In some cases, a low-order multipole field is superimposed on an octopole field to reduce the effects of axial deviation. In the case of a dodecapole lens, X- and Y-components of a quadrupole field and X- and Y-components of an octopole field can be created, for example, by applying magnetomotive forces to magnetic polepieces at ratios given in the table shown in FIG. 4. If the X-component of the quadrupole field is rotated through 45 degrees, the Y-component of the quadrupole field is obtained. If the X-component of the octopole field is rotated through 22.5 degrees, the Y-component of the octopole field results. The magnetomotive forces applied to the magnetic polepieces are determined by the numbers of turns of the coils wound on the magnetic polepieces and by currents flowing through the coils.

FIG. 5 schematically shows one conventional multipole lens, generally indicated by reference numeral 101A.

The multipole lens 101A is a dodecapole lens as shown in FIG. 5, and is configured including twelve magnetic polepieces 110-1 to 110-12, twelve coils 120, twelve power supplies 130-1 to 130-12, and a yoke 140. In the multipole lens 101A, the ratios of magnetomotive forces are controlled by the power supplies 130-1 to 130-12. Each of the coils 120 with the same shape and with the same number of turns is mounted to a respective one of the magnetic polepieces 110-1 to 110-12. Electric currents are supplied to these coils 120 from the independent power supplies 130-1 to 130-12, respectively. When one wants to superimpose the four kinds of fields consisting of the X- and Y-components of the quadrupole field and the X- and Y-components of the octopole field and to excite the coils and magnetic polepieces, the sum of magnetomotive forces to be impressed on the magnetic polepieces 110-1 to 110-12 is calculated using the table of FIG. 4. The amounts of currents passed through the coils 120 are found from the numbers of turns of the coils 120, and the outputs from the power supplies 130-1 to 130-12 are controlled.

FIG. 6 schematically shows another conventional multipole lens, generally indicated by reference numeral 101B.

As shown in FIG. 6, this multipole lens 101B is configured including twelve magnetic polepieces 110-1 to 110-12 (hereinafter may be collectively referred to as the magnetic polepieces 110), forty-eight coils 120, four power supplies 130-1 to 130-4 (hereinafter may be collectively referred to as the power supplies 130), and a yoke 140. In the multipole lens 101B, the ratios of the magnetomotive forces are controlled by the numbers of turns of the coils 120. The coils 120 having the numbers of turns which are proportional to the ratios of the magnetomotive forces listed in the table of FIG. 4 are mounted to the magnetic polepieces 110, respectively. These coils 120 are connected with their respective power supplies 130-1 to 130-4. As a result, the polepieces 110 are excited at the ratios of the magnetomotive forces creating the four kinds of fields, i.e., the X- and Y-components of the quadrupole field and the X- and Y-components of the octopole field, irrespective of the output currents from the power supplies 130.

If the coils 120 are controlled independently in the same way as for the multipole lens 101A shown in FIG. 5, various kinds of multipole fields can be generated. Furthermore, the number of the coils 120 can be suppressed to a minimum. However, in order to control the coils 120 independently, it is necessary to provide as many power supplies 130 as there are magnetic polepieces 110. Furthermore, variations in the currents flowing through the coils 120 give rise to deflecting fields and so the multipole lens is subject to the effects of noise.

The number of the power supplies 130 making up the multipole lens 101E shown in FIG. 6 is equal to a minimum number (four) of power supplies 130 producing the four kinds of fields. Furthermore, in the multipole lens 101B, the fields generated by the currents flowing through the coils 120 fundamentally contain no deflecting fields and, therefore, this lens is less subject to the effects of noise, it being noted that deflecting fields are generated only by axial deviations. However, the number of the coils 120 needed is equal to the number of fields multiplied by the number of magnetic polepieces. This greatly complicates wiring and terminal treatment. In addition, the ratios of the magnetomotive forces applied to the magnetic polepieces 110 must be controlled by the numbers of the turns of the coils 120, thus increasing the number of kinds of the required coils 120.

SUMMARY OF THE INVENTION

In view of the foregoing problem, the present invention has been made. One object associated with some aspects of the present invention is to provide a multipole lens which is simple in structure but capable of producing X- and Y components of a quadrupole field and X- and Y-components of an octopole field. It is another object associated with some aspects of the invention is to provide a charged particle beam system including this multipole lens.

(1) A multipole lens associated with the present invention has: first through twelfth polar elements disposed with rotational symmetry; first and second coils mounted on the first polar element; a third coil mounted on the second polar element; a fourth coil mounted on the third polar element; fifth and sixth coils mounted on the fourth polar element; a seventh coil mounted on the fifth polar element; an eighth coil mounted on the sixth polar element; ninth and tenth coils mounted on the seventh polar element; an eleventh coil mounted on the eighth polar element; a twelfth coil mounted on the ninth polar element; thirteenth and fourteenth coils mounted on the tenth polar element; a fifteenth coil mounted on the eleventh polar element; a sixteenth coil mounted on the twelfth polar element; a first power supply for supplying excitation currents to the first, fourth, ninth, and twelfth coils connected in series; a second power supply for supplying excitation currents to the third, fifth, eleventh, and thirteenth coils connected in series; a third power supply for supplying excitation currents to the sixth, eighth, fourteenth, and sixteenth coils connected in series; and a fourth power supply for supplying excitation currents to the second, seventh, tenth, and fifteenth coils connected in series.

The first, third, sixth, seventh, ninth, eleventh, fourteenth, and fifteenth coils produce magnetic fields in a first direction. The second, fourth, fifth, eighth, tenth, twelfth, thirteenth, and sixteenth coils produce magnetic fields in a direction opposite to the first direction.

In this multipole lens, there are only a minimum number (four) of power supplies to create the four kinds of fields. Also, the number of the coils can be reduced, for example, as compared with a multipole lens in which magnetomotive forces are controlled with coils. Furthermore, in this multipole lens, the coils have the same shape and the same number of turns. Hence, the multipole lens can be constructed using coils of only one type. Additionally, no restriction is placed on the number of turns. Consequently, this multipole lens is simple in structure but can produce X- and Y-components of a quadrupole field and X- and Y-components of an octopole field.

Furthermore, in this multipole lens, even if noise is superimposed on currents delivered, for example, from the power supplies, it is possible to cancel out deflecting fields other than the quadrupole and octopole fields and thus the effects of noise can be reduced.

(2) In one feature of this inventive multipole lens, the first through sixteenth coils may have the same number of turns.

This multipole lens is simple in structure but can produce X- and Y-components of a quadrupole field and X- and Y-components of an octopole field.

(3) In another feature of this multipole lens, the first, second, third, and fourth power supplies produce output currents I1, I2, I3, and I4, respectively, which may be in ratios of 0.732:0.268:−0.732:−0.268.

This multipole lens can produce an X-component of a quadrupole field.

(4) In a further feature of this multipole lens, the first, second, third, and fourth power supplies produce output currents I1, I2, I3, and I4, respectively, which may be in ratios of −0.732 1.000:0.732:−1.000.

This multipole lens can produce a Y-component of the quadrupole field.

(5) In a yet other feature of this multipole lens, the first, second, third, and fourth power supplies produce output currents I1, I2, I3, and I4, respectively, which may be in ratios of 0.268:0.732:0.268:−0.732.

This multipole lens can produce an X-component of an octopole field.

(6) In a still other feature of this multipole lens, the first, second, third, and fourth power supplies produce output currents I1, I2, I3, and I4, respectively, which may be in ratios of 1.000 0.732:1.000:0.732.

This multipole lens can produce a Y-component of the octopole field.

(7) In an additional feature of this multipole lens, assuming that the quadrupole field has an X-component of strength B1 and a Y-component of strength B2 and the octopole field has an X-component of strength B3 and a Y-component of strength B4 and that these strengths B1-B4 are in ratios of a:b:c:d (where a, b, c, d≥0), the first, second, third, and fourth power supplies produce output currents I1, I2, I3, and I4, respectively, which may be in ratios as given by $$\begin{pmatrix} I1 \\ I2 \\ I3 \\ I4 \end{pmatrix} = \begin{pmatrix} 0.732 & -0.732 & 0.268 & 1.000 \\ 0.268 & 1.000 & -0.732 & 0.732 \\ -0.732 & 0.732 & 0.268 & 1.000 \\ -0.268 & -1.000 & -0.732 & 0.732 \end{pmatrix} \begin{pmatrix} a \\ b \\ c \\ d \end{pmatrix} \quad (1)$$

This multipole lens can produce a field in which the X- and Y-components of the quadrupole field and the X- and Y-components of the octopole field are at least partially superimposed.

(8) A charged particle beam system associated with the present invention includes a multipole lens associated with the present invention.

This charged particle beam system can include a multipole lens which is simple in structure but capable of producing X- and Y-components of a quadrupole field and X- and Y-components of an octopole field.

BRIEF DESCRIPTION OF THE DRAWINGS

FIG. 2 is a table listing the ratios of magnetomotive forces applied to various polar elements of the multipole lens shown in FIG. 1.

FIG. 4 is a table listing the ratios of magnetomotive forces applied to various polar elements of one conventional multipole lens.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Multipole Lens

Figure 1:
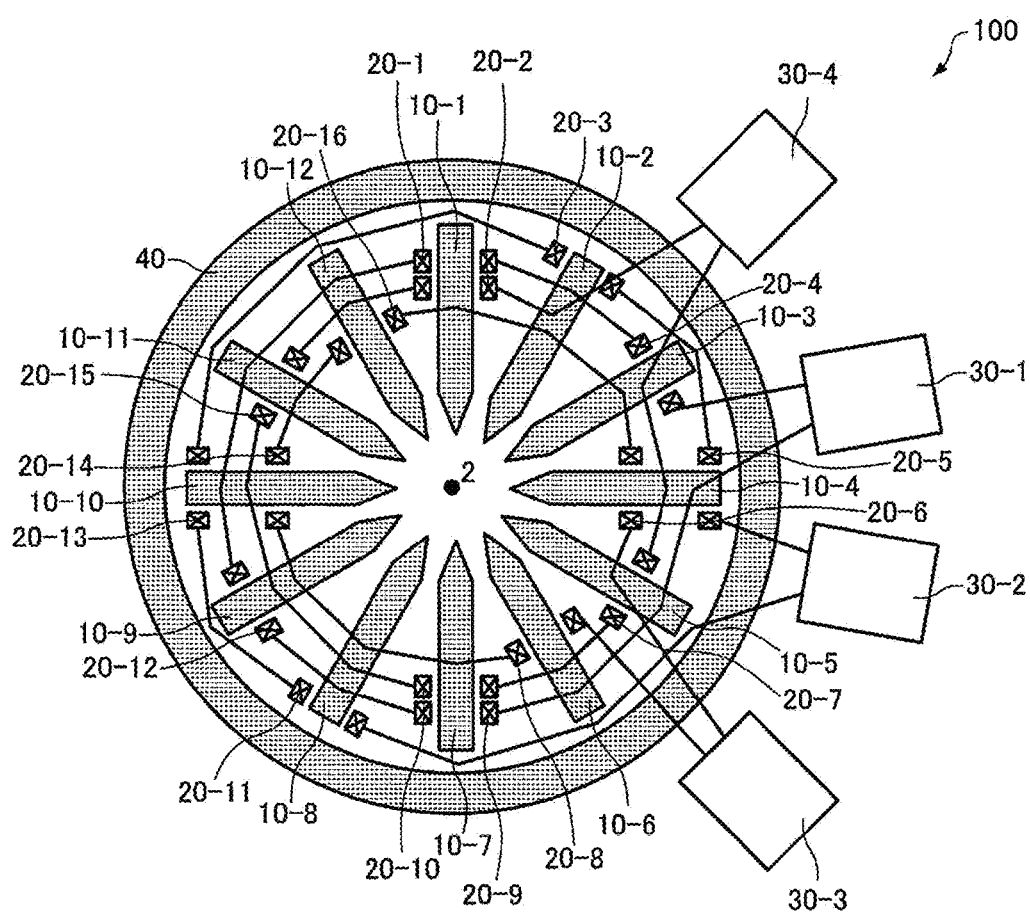
FIG. 1 is a schematic diagram of a multipole lens associated with one embodiment of the present invention.

A multipole lens associated with one embodiment of the present invention is first described by referring to FIG. 1, which schematically shows the multipole lens, generally indicated by reference numeral 100. This multipole lens 100 includes first through twelfth polar elements (magnetic polepieces) 10-1 to 10-12, first through sixteenth coils 20-1 to 20-16, first through fourth power supplies 30-1 to 30-4, and a yoke 40.

The first through twelfth polar elements 10-1 to 10-12 are arranged in rotational symmetry about the optical axis 2 of the multipole lens 100. In the multipole lens 100, the first polar element 10-1, second polar element 10-2, third polar element 10-3, fourth polar element 10-4, and so on are arranged up to the twelfth polar element 10-12 clockwise in this order and spaced 30 degrees from each other.

The polar elements 10-1 to 10-12 are arranged to extend from the yoke 40 toward the optical axis 2. In other words, the polar elements 10-1 to 10-12 run radially about a circle centered at the optical axis 2. The first through twelfth polar elements 10-1 to 10-12 are mounted radially as viewed within a plane (i.e., as viewed perpendicular to the optical axis 2).

The polar elements 10-1 to 10-12 are magnetically coupled to the yoke 40. In the example shown in FIG. 1, the polar elements 10-1 to 10-12 are spaced from the yoke 40 but magnetic flux leaks into and propagates through the spaces between each of the polar elements 10-1 to 10-12 and the yoke 40. Alternatively, the polar elements 10-1 to 10-12 may be in contact with the yoke 40 in an unillustrated manner.

The first coil 20-1 and second coil 20-2 are mounted on the first polar element 10-1. The third coil 20-3 is mounted on the second polar element 10-2. The fourth coil 20-4 is mounted on the third polar element 10-3. The fifth and sixth coils 20-5 and 20-6, respectively, are mounted on the fourth polar element 10-4. The seventh coil 20-7 is mounted on the fifth polar element 10-5. The eighth coil 20-8 is mounted on the sixth polar element 10-6. The ninth and tenth coils 20-9 and 20-10, respectively, are mounted on the seventh polar element 10-7. The eleventh coil 20-11 is mounted on the eighth polar element 10-8. The twelfth coil 20-12 is mounted on the ninth polar element 10-9. The thirteenth and fourteenth coils 20-13 and 20-14, respectively, are mounted on the tenth polar element 10-10. The fifteenth coil 20-15 is mounted on the eleventh polar element 10-11. The sixteenth coil 20-16 is mounted on the twelfth polar element 10-12.

The coils 20-1 to 20-16 are wound on cores formed by base portions of their respective polar elements 10-1 to 10-12 which are end portions on the side of the yoke 40. The first through sixteenth coils 20-1 to 20-16 have the same shape and produce the same magnetomotive force when energized with the same electric current. That is, the first through sixteenth coils 20-1 to 20-16 have the same number of turns.

The first coil 20-1, fourth coil 20-4, ninth coil 20-9, and twelfth coil 20-12 are connected in series with each other and with the first power supply 30-1. The third coil 20-3, fifth coil 20-5, eleventh coil 20-11, and thirteenth coil 20-13 are connected in series with each other and with the second power supply 30-2. The sixth coil 20-6, eighth coil 20-8, fourteenth coil 20-14, and sixteenth coil 20-16 are connected in series with each other and with the third power supply 30-3. The second coil 20-2, seventh coil 20-7, tenth coil 20-10, and fifteenth coil 20-15 are connected in series with each other and with the fourth power supply 30-4.

FIG. 2 is a table listing magnetomotive forces applied to the polar elements 10-1 to 10-12 of the multipole lens 100 associated with the present embodiment. In this table of FIG. 2, (magnetic) polepiece numbers 1 to 12 correspond to the first through twelfth polar elements 10-1 to 10-12, respectively.

The first coil 20-1, third coil 20-3, sixth coil 20-6, seventh coil 20-7, ninth coil 20-9, eleventh coil 20-11, fourteenth coil 20-14, and fifteenth coil 20-15 produce magnetic fields, for example, directed from the base end side of each corresponding polar element toward the front end side. The second coil 20-2, fourth coil 20-4, fifth coil 20-5, eighth coil 20-8, tenth coil 20-10, twelfth coil 20-12, thirteenth coil 20-13, and sixteenth coil 20-16 generate magnetic fields directed from the front end side of each corresponding polar element toward the base end side. That is, the magnetic fields produced by the coils 20-1, 20-3, 20-6, 20-7, 20-9, 20-11, 20-14, and 20-15 are opposite in direction to the magnetic fields produced by the coils 20-2, 20-4, 20-5, 20-8, 20-10, 20-12, 20-13, and 20-16 as can be seen from positive and negative signs given to the numeral values listed in the table of FIG. 2.

The directions of the magnetic fields produced by the coils 20-1 to 20-16 may be controlled by varying the wiring (i.e., by reversing the polarities of cables connected with the coils while maintaining the senses of the coils unchanged) or varying the senses (polarities) of the coils 20-1 to 20-6.

The first power supply 30-1 supplies excitation currents to the first coil 20-1, fourth coil 20-4, ninth coil 20-9, and twelfth coil 20-12 that are connected in series. The second power supply 30-2 supplies excitation currents to the third coil 20-3, fifth coil 20-5, eleventh coil 20-11, and thirteenth coil 20-13 connected in series. The third power supply 30-3 supplies excitation currents to the sixth coil 20-6, eighth coil 20-8, fourteenth coil 20-14, and sixteenth coil 20-16 connected in series. The fourth power supply 30-4 supplies excitation currents to the second coil 20-2, seventh coil 20-7, tenth coil 20-10, and fifteenth coil 20-15 connected in series.

The polar elements 10-1 to 10-12 are excited at the ratios of magnetomotive forces listed in the table of FIG. 2 by supplying currents from the power supplies 30-1 to 30-4.

The yoke 40 is a member for permitting the magnetic flux generated by the coils 20-1 to 20-16 to be guided effectively to the polar elements 10-1 to 10-12. The yoke 40 is mounted annularly as viewed within a plane. The 12 polar elements 10-1 to 10-12 are disposed inside the yoke 40. The polar elements 10-1 to 10-12 and yoke 40 are made, for example, of a soft magnetic substance such as Permalloy.

2. Operation of Multipole Lens

The operation of the multipole lens 100 associated with the present embodiment is next described. Table 1 shows relations between the fields excited by the multipole lens 100 and current ratios provided by the first through fourth power supplies 30-1 to 30-4. In table 1, each minus sign indicates that the direction of flow of current is reversed.

TABLE 1

|  | first power supply | second power supply | third power supply | fourth power supply |
| --- | --- | --- | --- | --- |
| X-component of quadrupole field | 0.732 | 0.268 | −0.732 | −0.268 |
| Y-component of quadrupole field | −0.732 | 1.000 | 0.732 | −1.000 |
| X-component of octopole field | 0.268 | −0.732 | 0.268 | −0.732 |
| Y-component of octopole field | 1.000 | 0.732 | 1.000 | 0.732 |

As presented in table 1, assuming that the output current I1 from the first power supply 30-1, the output current I2 from the second power supply 30-2, the output current I3 from the third power supply 30-3, and the output current I4 from the fourth power supply 30-4 are in ratios of 0.732: 0.268:−0.732:−0.268, an X-component of a quadrupole field can be produced.

Assuming that the output current I1 from the first power supply 30-1, the output current I2 from the second power supply 30-2, the output current I3 from the third power supply 30-3, and the output current I4 from the fourth power supply 30-4 are in ratios of −0.732:1.000:0.732:−1.000, a Y-component of the quadrupole field can be produced. A field obtained by rotating the X-component of the quadrupole field through 45 degrees is the Y-component of the quadrupole field.

Assuming that the output current I1 from the first power supply 30-1, the output current I2 from the second power supply 30-2, the output current I3 from the third power supply 30-3, and the output current I4 from the fourth power supply 30-4 are in ratios of 0.268:−0.732:0.268:0.732, an X-component of an octopole field can be produced.

Assuming that the output current I1 from the first power supply 30-1, the output current I2 from the second power supply 30-2, the output current I3 from the third power supply 30-3, and the output current I4 from the fourth power supply 30-4 are in ratios of 1.000:0.732:1.000:0.732, a Y-component of the octopole field can be produced. A field obtained by rotating the X-component of the octopole field through 22.5 degrees is a Y-component of the octopole field.

Where a field in which four kinds of fields are superimposed is produced, the first through fourth power supplies 30-1 to 30-4 produce output currents in ratios listed in Table 1 according to the strengths of the excited four types of fields. For example, if the strength B1 of the X-component of the quadrupole field, the strength B2 of the Y-component of the quadrupole field, the strength B3 of the X-component of the octopole field, and the strength B4 of the Y-component of the octopole field are in ratios of a:b:c:d (where a, b, c, d≥0), the ratios of the output currents from the power supplies 30-1 to 30-4 are given by $$\begin{pmatrix} I1 \\ I2 \\ I3 \\ I4 \end{pmatrix} = \begin{pmatrix} 0.732 & -0.732 & 0.268 & 1.000 \\ 0.268 & 1.000 & -0.732 & 0.732 \\ -0.732 & 0.732 & 0.268 & 1.000 \\ -0.268 & -1.000 & -0.732 & 0.732 \end{pmatrix} \begin{pmatrix} a \\ b \\ c \\ d \end{pmatrix} \quad (1)$$

Consequently, it is possible to create a desired multipole field in which the X- and Y-components of the quadrupole field and the X- and Y-components of the octopole field are at least partially superimposed.

The multipole lens 100 has the following features. The multipole lens 100 comprises: the first through twelfth polar elements 10-1 to 10-12, first coil 20-1 and second coil 20-2 mounted on the first polar element 10-1, third coil 20-3 mounted on the second polar element 10-2, fourth coil 20-4 mounted on the third polar element 10-3, fifth coil 20-5 and sixth coil 20-6 mounted on the fourth polar element 10-4, seventh coil 20-7 mounted on the fifth polar element 10-5, eighth coil 20-8 mounted on the sixth polar element 10-6, ninth coil 20-9 and tenth coil 20-10 mounted on the seventh polar element 10-7, eleventh coil 20-11 mounted on the eighth polar element 10-8, twelfth coil 20-12 mounted on the ninth polar element 10-9, thirteenth coil 20-13 and fourteenth coil 20-14 mounted on the tenth polar element 10-10, fifteenth coil 20-15 mounted on the eleventh polar element 10-11, sixteenth coil 20-16 mounted on the twelfth polar element 10-12, first power supply 30-1 for supplying excitation currents to the coils 20-1, 20-4, 20-9, and 20-12 connected in series, second power supply 30-2 for supplying excitation currents to the coils 20-3, 20-5, 20-11, and 20-13 connected in series, third power supply 30-3 for supplying excitation currents to the coils 20-6, 20-8, 20-14, and 20-16 connected in series, and fourth power supply 30-4 for supplying excitation currents to the coils 20-2, 20-7, 20-10, and 20-15 connected in series. The coils 20-1, 20-3, 20-6, 20-7, 20-9, 20-11, 20-14, and 20-15 produce magnetic fields in the first direction. The coils 20-2, 20-4, 20-5, 20-8, 20-10, 20-12, 20-13, and 20-16 produce magnetic fields in a direction opposite to the first direction.

In this multipole lens 100, if noise is superimposed on the output currents from the power supplies 30-1 to 30-4, for example, deflecting fields other than the above-described four kinds of fields can be canceled out on the optical axis 2. In consequence, in the multipole lens 100, the effects of noise can be reduced.

Figure 6:
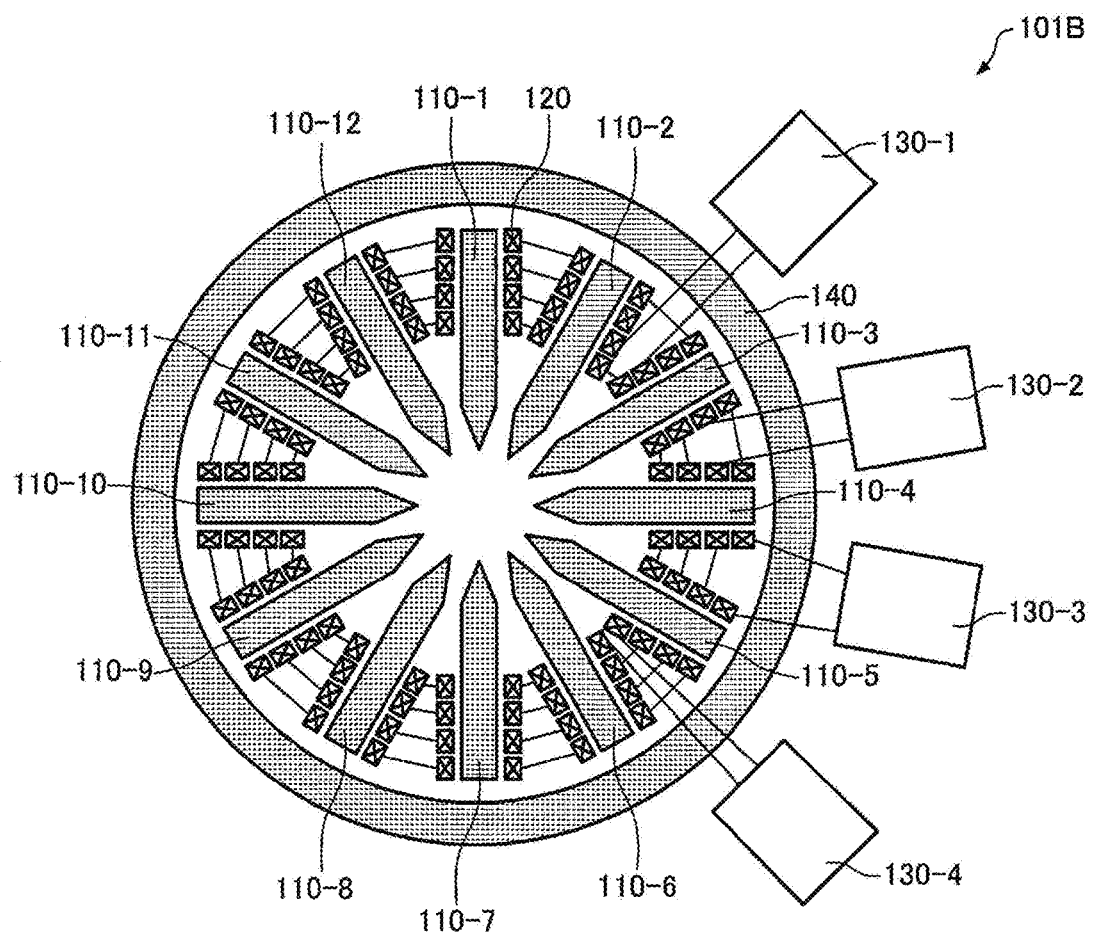
FIG. 6 is a schematic diagram of another conventional multipole lens.

Furthermore, in this multipole lens 100, there are only a minimum number of (four) power supplies 30-1 to 30-4 to produce the four kinds of fields. In addition, the multipole lens 100 includes the 16 coils 20-1 to 20-16, which can be made fewer in number than in the case of the multipole lens 101B where magnetomotive forces are controlled by the 4×12 coils 120 shown in FIG. 6.

The multipole lens 100 uses the coils 20-1 to 20-16 of the same shape (i.e., having the same number of turns) and, therefore, can be made up of only one kind of coils. Furthermore, no restriction is placed on the number of turns. For example, in the multipole lens 101B shown in FIG. 6, coils with numbers of turns proportional to the ratios of magnetomotive forces listed in the table shown in FIG. 4 must be used. For this reason, where the numbers of turns are suppressed, for example, to below 10, in order to allow for miniaturization, it is difficult to prepare coils with numbers of turns proportional to the ratios of magnetomotive forces listed in the table of FIG. 4. In contrast, for the multipole lens 100, it suffices to prepare coils having the same number of turns. Also, no restriction is imposed on the number of turns. Hence, the multipole lens 100 does not suffer from this problem.

In this way, the multipole lens 100 has a few number of power supplies 30-1 to 30-4. Furthermore, less limitations are placed on design parameters such as the number of the coils 20-1 to 20-16 and the number of turns of the coils. The multipole lens can be simple in structure but permits generation of X- and Y-components of a quadrupole field and X- and Y-components of an octopole field.

3. Charged Particle Beam System

Figure 3:
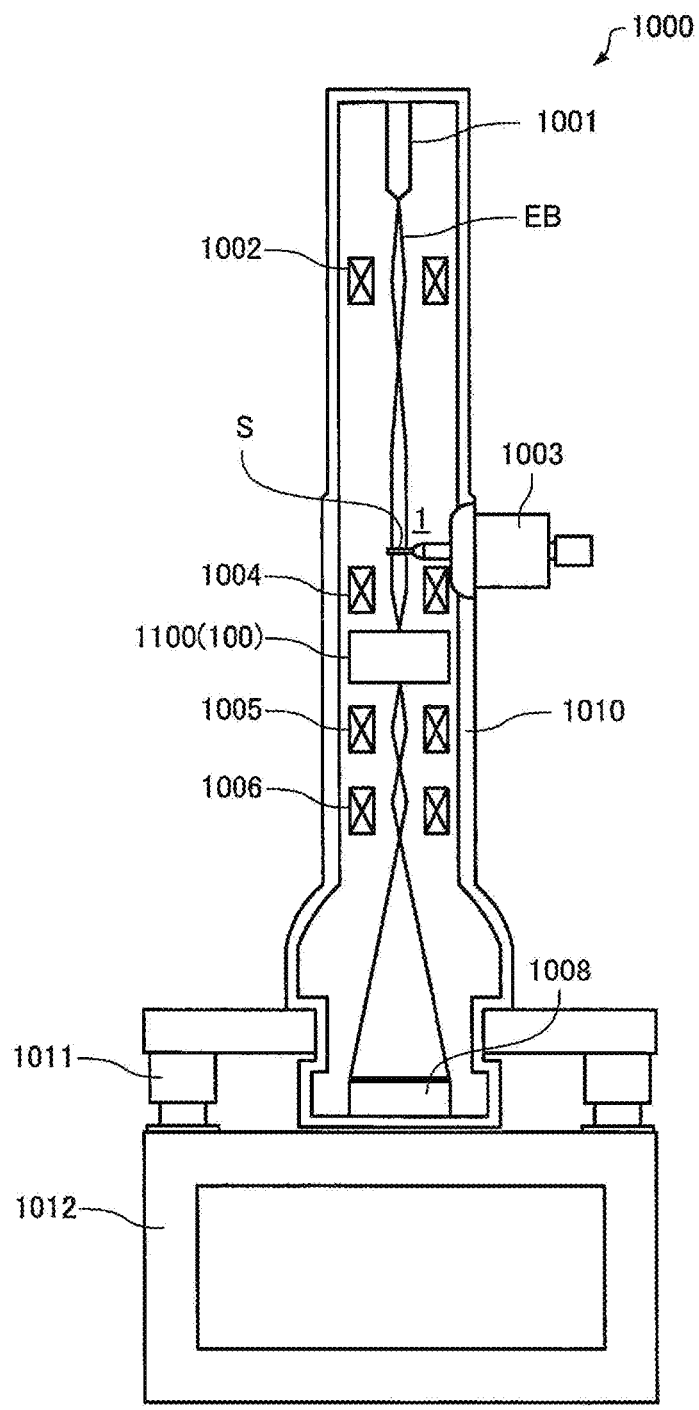
FIG. 3 is a diagram illustrating the configuration of a charged particle beam system associated with another embodiment of the present invention.
Figure 5:
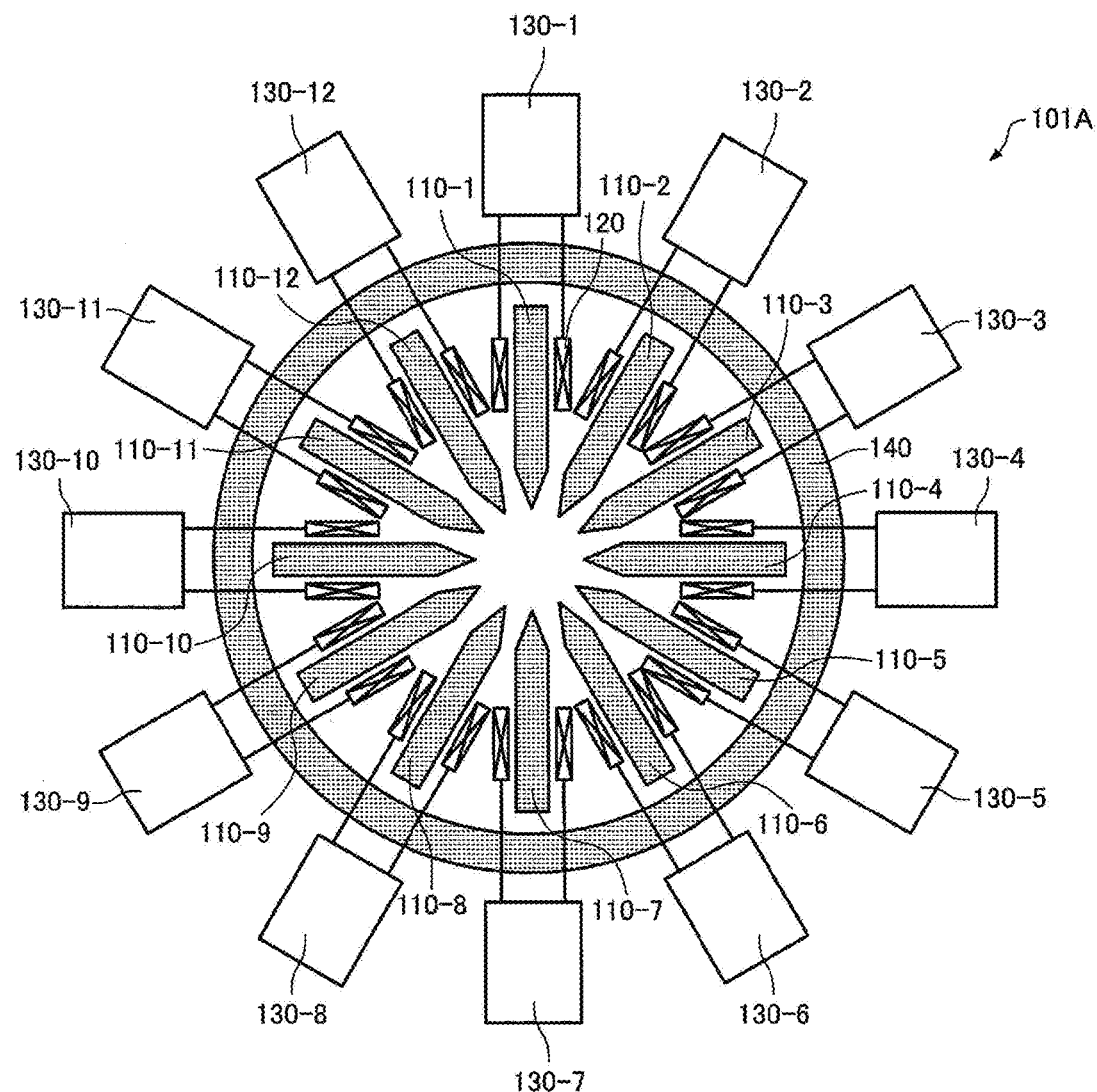
FIG. 5 is a schematic diagram of the conventional multipole lens.

A charged particle beam system associated with another embodiment of the present invention is next described by referring to FIG. 3, which illustrates the configuration of the charged particle beam system, generally indicated by reference numeral 1000. In the following example, the charged particle beam system 1000 is a transmission electron microscope (TEM).

As shown in FIG. 3, the charged particle beam system 1000 is configured including an electron beam source 1001, condenser lenses 1002, a sample stage 1003, an objective lens 1004, an aberration corrector 1100, an intermediate lens 1005, a projector lens 1006, and an imager 1008.

The electron beam source (charged particle beam source) 1001 produces an electron beam EB by accelerating electrons by means of an anode, the electrons being emitted from a cathode. A well-known electron gun can be used as the electron beam source 1001. No restrictions are imposed on the electron gun used as the electron beam source 1001. For example, a thermionic-emission electron gun, thermal field emission electron gun, cold cathode field-emission electron gun, or the like can be used.

The condenser lenses 1002 are disposed behind the electron beam source 1001 and operate to focus the electron beam EB produced by the electron beam source 1001 onto a sample S.

The sample S is held by a sample holder in a sample chamber 1 that is a space within an electron optical column 1010. The interior of the sample chamber 1 is maintained in a vacuum. In the sample chamber 1, the sample S is irradiated with the charged particle beam (electron beam EB).

The sample stage 1003 places and holds the sample S in position within the sample chamber 1. In the illustrated example, the sample stage 1003 constitutes a side entry stage for inserting the sample holder and thus the sample S from a side of the objective lens 1004.

The objective lens 1004 is disposed behind the condenser lenses 1002. The objective lens 1004 is an initial stage of lens for focusing the electron beam EB transmitted through the sample S.

The objective lens 1004 has a top polepiece and a bottom polepiece (none of which are shown). In the objective lens 1004, a magnetic field is produced between the top and bottom polepieces to focus the electron beam EB. The top and bottom polepieces are so positioned that the sample S is sandwiched between them.

The aberration corrector 1100 is disposed behind the objective lens 1004, and is configured including the multipole lens 100 associated with the present invention. The aberration corrector 1100 is built in such that the optical axis 2 (see FIG. 1) of the multipole lens 100 is coincident with the optical axis of the charged particle beam system 1000. The system 1000 can correct aberrations such as spherical aberration in the imaging system of the beam system 1000 by producing given magnetic fields (X- and Y-components of the quadrupole field and X- and Y-components of the octopole field or a superimposition of these components) by means of the multipole lens 100. As a result, high-resolution electron microscope images can be obtained.

The intermediate lens 1005 is located behind the objective lens 1004. The projector lens 1006 is positioned behind the intermediate lens 1005. The intermediate lens 1005 and projector lens 1006 cooperate such that the image focused by the objective lens 1004 is further magnified and focused onto the imager 1008.

The imager 1008 captures an image such as an electron microscope image or electron diffraction pattern focused by the projector lens 1006. For example, the imager 1008 is a digital camera. The imager 1008 outputs information about the captured electron microscope image or electron diffraction pattern. The outputted information is processed by image processing circuitry (not shown) and displayed on a display device (not shown). The display device is a CRT, LCD, touch panel display, or the like, for example.

In the illustrated example, the charged particle beam system 1000 is mounted over a pedestal 1012 via vibration isolators 1011.

In the description of the example provided herein, the multipole lens associated with the present invention is installed in an aberration corrector for an imaging system. The multipole lens associated with the present invention may be installed in an aberration corrector for correcting aberrations in an illumination system.

Furthermore, in the description of the example provided herein, the multipole lens associated with the present invention is applied to a transmission electron microscope. The lens may also be applied to other types of charged particle beam system such as scanning electron microscope (SEM), scanning transmission electron microscope (STEM), focused ion beam (FIB) system, and electron beam exposure system.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. A multipole lens comprising:
first through twelfth polar elements disposed with rotational symmetry;
first and second coils mounted on the first polar element;
a third coil mounted on the second polar element;
a fourth coil mounted on the third polar element;
fifth and sixth coils mounted on the fourth polar element;
a seventh coil mounted on the fifth polar element;
an eighth coil mounted on the sixth polar element;
ninth and tenth coils mounted on the seventh polar element;
an eleventh coil mounted on the eighth polar element;
a twelfth coil mounted on the ninth polar element;
thirteenth and fourteenth coils mounted on the tenth polar element;
a fifteenth coil mounted on the eleventh polar element;
a sixteenth coil mounted on the twelfth polar element;
a first power supply for supplying excitation currents to the first, fourth, ninth, and twelfth coils connected in series;
a second power supply for supplying excitation currents to the third, fifth, eleventh, and thirteenth coils connected in series;
a third power supply for supplying excitation currents to the sixth, eighth, fourteenth, and sixteenth coils connected in series; and
a fourth power supply for supplying excitation currents to the second, seventh, tenth, and fifteenth coils connected in series,
wherein the first, third, sixth, seventh, ninth, eleventh, fourteenth, and fifteenth coils produce magnetic fields in a first direction; and
wherein the second, fourth, fifth, eighth, tenth, twelfth, thirteenth, and sixteenth coils produce magnetic fields in a direction opposite to the first direction.

2. The multipole lens as set forth in claim 1, wherein said first through sixteenth coils have the same number of turns.

3. The multipole lens as set forth in claim 1, wherein said first, second, third, and fourth power supplies produce output currents I1, I2, I3, and I4, respectively, which are in ratios of 0.732:0.268:−0.732:−0.268.

4. The multipole lens as set forth in claim 1, wherein said first, second, third, and fourth power supplies produce output currents I1, I2, I3, and I4, respectively, which are in ratios of −0.732:1.000:0.732:−1.000.

5. The multipole lens as set forth in claim 1, wherein said first, second, third, and fourth power supplies produce output currents I1, I2, I3, and I4, respectively, which are in ratios of 0.268:−0.732:0.268:−0.732.

6. The multipole lens as set forth in claim 1, wherein said first, second, third, and fourth power supplies produce output currents I1, I2, I3, and I4, respectively, which are in ratios of 1.000:0.732:1.000:0.732.

7. The multipole lens as set forth in claim 1, wherein assuming that said quadrupole field has an X-component of strength B1 and a Y-component of strength B2 and said octopole field has an X-component of strength B3 and a Y-component of strength B4 and that these strengths B1-B4 are in ratios of a:b:c:d (where a, b, c, d≥0), the first, second, third, and fourth power supplies produce output currents I1, I2, I3, and I4, respectively, which are in ratios given by $$\begin{pmatrix} I1 \\ I2 \\ I3 \\ I4 \end{pmatrix} = \begin{pmatrix} 0.732 & -0.732 & 0.268 & 1.000 \\ 0.268 & 1.000 & -0.732 & 0.732 \\ -0.732 & 0.732 & 0.268 & 1.000 \\ -0.268 & -1.000 & -0.732 & 0.732 \end{pmatrix} \begin{pmatrix} a \\ b \\ c \\ d \end{pmatrix}. \quad (1)$$

8. A charged particle beam system including a multipole lens as set forth in claim 1.

\* \* \* \* \*